(12) United States Patent
Suzuki

(10) Patent No.: US 7,646,145 B2
(45) Date of Patent: Jan. 12, 2010

(54) ORGANIC EL LIGHT EMITTING DEVICE

(75) Inventor: Takeshi Suzuki, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 616 days.

(21) Appl. No.: 10/515,449

(22) PCT Filed: May 21, 2003

(86) PCT No.: PCT/JP03/06324

§ 371 (c)(1),
(2), (4) Date: Jan. 6, 2005

(87) PCT Pub. No.: WO03/098976

PCT Pub. Date: Nov. 27, 2003

(65) Prior Publication Data

US 2005/0162073 A1    Jul. 28, 2005

(30) Foreign Application Priority Data

May 22, 2002    (JP) ............................. 2002-148211

(51) Int. Cl.
*H01J 63/04* (2006.01)
(52) U.S. Cl. .................................................. 313/504
(58) Field of Classification Search .................. 313/504, 313/506
See application file for complete search history.

(56) References Cited

U.S. PATENT DOCUMENTS

| | | | | | |
|---|---|---|---|---|---|
| 2,966,427 | A | * | 12/1960 | Breining ................. | 427/255.26 |
| 3,943,168 | A | * | 3/1976 | Patterson ................ | 252/519.14 |
| 4,339,270 | A | * | 7/1982 | Hashimoto et al. .......... | 148/403 |
| 4,560,454 | A | * | 12/1985 | Harris et al. ................ | 205/474 |
| 4,705,610 | A | * | 11/1987 | Tenhover et al. ............ | 205/474 |
| 4,709,363 | A | * | 11/1987 | Dirks et al. ............... | 369/275.1 |
| 4,714,804 | A | * | 12/1987 | Yasuda et al. ............ | 200/11 DA |
| 4,776,934 | A | * | 10/1988 | Hoare ....................... | 205/681 |
| 4,885,211 | A | * | 12/1989 | Tang et al. .................. | 428/457 |
| 5,032,464 | A | * | 7/1991 | Lichtenberger ............. | 428/596 |

(Continued)

FOREIGN PATENT DOCUMENTS

JP    60-194001 A    10/1985

(Continued)

OTHER PUBLICATIONS

Notification of First Office Action (PCT) issued in corresponding Chinese patent application No. 038116855, issued Dec. 7, 2007.

(Continued)

*Primary Examiner*—Toan Ton
*Assistant Examiner*—Hana A Sanei
(74) *Attorney, Agent, or Firm*—Rossi, Kimms & McDowell LLP

(57) ABSTRACT

An organic EL light-emitting device includes a substrate, thin films having a reflecting function formed on the substrate, an organic EL light-emitting layer, and upper electrodes. The thin films having a reflecting function are formed from an amorphous alloy, whereby there can be provided an organic EL light-emitting device having reflective films that have all of a reflecting function, a function of shielding transistors from light, and an electrode function, and moreover have little surface unevenness.

10 Claims, 2 Drawing Sheets

U.S. PATENT DOCUMENTS

| | | | |
|---|---|---|---|
| 5,111,335 A * | 5/1992 | Horiuti et al. | 359/350 |
| 5,447,801 A * | 9/1995 | Masuda et al. | 428/567 |
| 5,521,759 A | 5/1996 | Dobrowolski et al. | |
| 5,705,284 A * | 1/1998 | Hosokawa et al. | 428/690 |
| 5,739,545 A | 4/1998 | Guha et al. | |
| 5,760,981 A * | 6/1998 | Gillich | 359/883 |
| 6,071,110 A | 6/2000 | Mikkelsen | 425/327 |
| 2002/0001870 A1* | 1/2002 | Oda et al. | 438/48 |
| 2002/0003227 A1* | 1/2002 | Kageyama et al. | 252/512 |
| 2002/0045066 A1* | 4/2002 | Beierlein et al. | 428/690 |
| 2002/0079026 A1* | 6/2002 | Richardson et al. | 148/403 |
| 2002/0190643 A1* | 12/2002 | Cummings et al. | 313/553 |

FOREIGN PATENT DOCUMENTS

| | | |
|---|---|---|
| JP | 08-288071 A | 11/1996 |
| JP | 10-149882 A | 6/1998 |
| JP | 11-61398 A | 3/1999 |
| JP | 2001-176660 A | 6/2001 |
| JP | 2001-230072 A | 8/2001 |
| JP | 2002-093579 A | 3/2002 |
| JP | 2002-93579 A | 3/2002 |
| JP | 2002-339084 A | 11/2002 |
| WO | 01/06576 A1 | 1/2001 |

OTHER PUBLICATIONS

Office Action issued to a related Japanese Application No. 2004-506321, dated Feb. 14, 2008, and translation of relevant portions thereof.

Office Action dated Feb. 4, 2009, issued in corresponding German Application No. 103 92 605.4-33. English translation provided.

Notifications of Reasons for Refusal, dated Oct. 3, 2008, issued in corresponding JP application No. 2004-560321.

Office Action issued in corresponding PCT application No. 2004-7018466, dated Apr. 30, 2009. Partial translation provided.

* cited by examiner

ORGANIC EL LIGHT EMITTING DEVICE

TECHNICAL FIELD

The present invention relates to the structure of an organic EL (electroluminescent) light-emitting device and a method of manufacturing the same.

BACKGROUND ART

Generally, with an organic EL light-emitting device, transparent electrodes are provided on a glass substrate, an organic EL light-emitting layer is provided thereon, and layers having the functions of both electrodes and reflective films are further formed at a rear surface using aluminum, silver or the like for increasing the amount of light extracted to the outside; light is then extracted out from the glass surface.

On the other hand, there have been trials into using polycrystalline silicon TFTs as an effective driving method in the case of applying a light-emitting device to a display or the like. With this TFT driving method, as conventionally there is again a method in which light is extracted from the TFT substrate side, but in this case the transistors must be placed in gaps between light-emitting parts, and hence there are problems such as the area of the TFT devices being restricted.

One can thus envisage a method in which the transistors are made so as to extend out as far as the regions of the light-emitting parts, and the light is extracted from the opposite side to the substrate (a top emission method). When this method is adopted, it is necessary to form on the TFT substrate reflective films that have both a reflecting function and a function of shielding the transistors from light. Furthermore, these reflective films preferably also function as electrodes.

When forming an organic EL light-emitting layer on these reflective films, unevenness of the surface of the reflective films becomes a problem. The organic EL light-emitting layer is thin, having an overall thickness of approximately 200 nm, and moreover out of the organic EL light-emitting layer, an electron transport layer where electric field concentration occurs is extremely thin at approximately 30 nm. There is thus a problem that if there is severe unevenness on the surface on which the device is formed, then electric field concentration will occur, short-circuiting of the device will occur, and parts where light cannot be emitted (dark spots) will be formed.

When manufacturing a high-quality top emission type organic EL device, it is thus important to form reflective films that have all of a reflecting function, a function of shielding the transistors from light, and an electrode function, and moreover have little surface unevenness.

Moreover, an extremely thin organic EL light-emitting layer as described above is also used in organic EL light-emitting devices in which not active matrix driving using TFTs but rather passive matrix driving is carried out. In the case of carrying out passive matrix driving, it is thus again important to form reflective films having little surface unevenness.

SUMMARY OF THE INVENTION

To solve the above-described problems, the present invention is directed to a structure in which the reflective films are formed from an alloy having a specific element ratio giving an amorphous phase, whereby reflective films having little surface unevenness are obtained.

An organic EL light-emitting device that is a first embodiment of the present invention is an organic light-emitting device in which thin films having a reflecting function are formed in advance on a surface on which the device is to be formed, and then light-emitting parts are formed thereon, and is characterized in that the thin films having a reflecting function are formed from an amorphous alloy.

BRIEF DESCRIPTION OF THE DRAWINGS

The invention will now be described with reference to certain preferred embodiments thereof, wherein.

DETAILED DESCRIPTION OF THE PREFERRED EMBODIMENTS OF THE INVENTION

Figure 1:
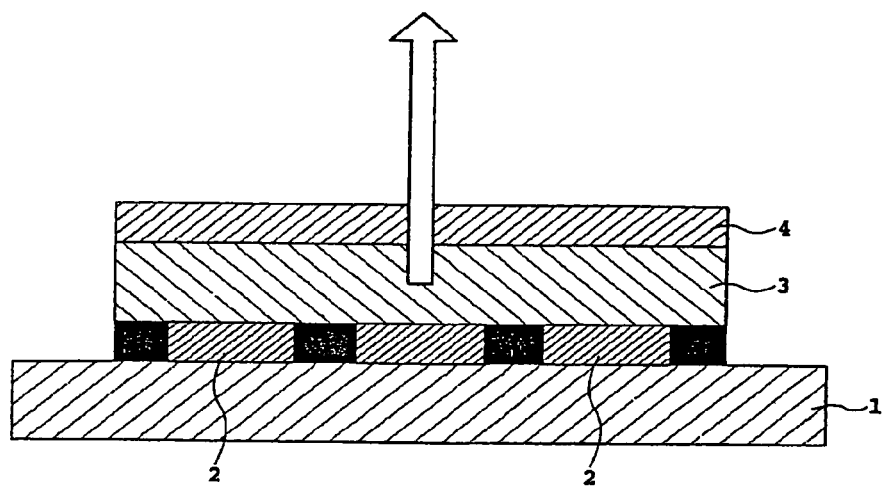
FIG. 1 is a schematic sectional view of an organic EL light-emitting device of the present invention.

The following is a detailed description of an organic EL light-emitting device of the present invention. The organic EL light-emitting device of the present invention is shown in FIG. 1. The organic EL light-emitting device comprises a substrate 1, thin films 2 having a reflecting function formed on the substrate, an organic EL light-emitting layer 3, and upper electrodes 4.

The results of measurements using an AFM on a surface region (2 μm square) in the case that 3 nm or 100 nm of Al, which is generally used for reflective films, was deposited by vapor deposition on a glass substrate are shown in Table 1. From Table 1, it can be seen that the surface unevenness increases as the Al grows.

TABLE 1

Surface roughness of Al thin films

| | Average surface roughness (nm) | Peak to valley (nm) |
|---|---|---|
| Glass | 0.21 | 3.06 |
| Al (3 nm)/glass | 088 | 11.74 |
| Al (100 nm)/glass | 2.74 | 38.85 |

The reason that the unevenness increases as the film grows in this way is thought to be that Al readily crystallizes. That is, Al that has reached the substrate surface can migrate relatively freely over a certain region of the surface (surface migration). In this process, if there are places where the adsorption potential is large, then the residence time there will be long, and as a result the film growth rate at these parts will be high, causing unevenness to be produced. In the case of a simple metal, these parts where the adsorption potential is large are parts where the crystallinity is high.

Upon actually taking sectional TEM images of Al thin films, it has been found that the film thickness is lower in twin crystal parts (parts between two crystals) where the crystallinity is poor. It is thought that if such unevenness in the residence time over the surface could be eliminated, then a flat metal surface would be obtained.

One can envisage two methods for doing this. One method is to grow the reflective films 2 as a perfect single crystal. However, to grow the reflective films 2 as a perfect single crystal, generally epitaxial growth must be carried out, and hence this is not practical when considering application to an organic EL light-emitting device in which the device is formed on glass or an organic film. The second method is to grow the reflective films 2 as a completely amorphous phase. In the case of growing the reflective films 2 as an amorphous phase, parts having a large adsorption potential will not arise, and hence it will be possible to form flat films.

As a material that can be grown as an amorphous phase, it is practical to use an alloy. For the alloy to form an amorphous phase, it is preferable for the mixing enthalpy of the elements constituting the alloy to be negative, and for the atomic radius ratio r/R (where R>r) of the constituent elements to be not more than 0.9, preferably not more than 0.85. As such a combination, 1) a transition metal-phosphorus alloy, 2) a transition metal-boron alloy, or 3) a transition metal-lanthanide alloy can be used. Note that in the present specification, 'transition metal' means an element from groups 3 to 12 of the periodic table excluding the lanthanides and the actinides series (e.g. in the case of group 4 of the periodic table, the elements from Sc to Zn). Moreover, in the present specification, 'lanthanide' means an element having an atomic number from 57 (La) to 71 (Lu).

In the case of using a transition metal-phosphorus alloy for the reflective films 2, the alloy may contain 10 to 50 at %, preferably 12 to 30 at %, of phosphorus. In the case of using a transition metal-boron alloy for the reflective films 2, the alloy may contain 10 to 50 at %, preferably 12 to 30 at %, of boron. Alternatively, in the case of using a transition metal-lanthanide alloy for the reflective films 2, the alloy may contain 10 to 50 at %, preferably 25 to 50 at %, of a lanthanide.

Moreover, one element may be used as the transition metal, or two or more elements may be used. In the present invention, preferable transition metals include Ni, Cr, Pt, Ir, Rh, Pd and Ru, with Ni and Cr being particularly preferable.

In the present invention, the higher the transition metal content, the higher the reflectivity of the reflective films 2 can be made. The optimum transition metal content depends on other desired properties, and can be easily determined by a person skilled in the art.

In the present invention, the reflective films 2 can be formed on the substrate using a method such as vapor deposition or sputtering. The substrate used here may be a TFT substrate on which TFTs for driving have already been formed. Moreover, in the case of forming a device with passive matrix driving, a glass substrate, a plastic substrate or the like can be used.

In the present invention, the reflective films 2 have a thickness of at least 20 nm, preferably 70 to 150 nm. Through having such a thickness, good reflectivity, and good ability to shield the TFTs from light (in the case of using TFTs) can be realized.

Moreover, in the present invention, due to being made of an electrically conductive alloy, the reflective films 2 can also be used as lower electrodes of the organic EL light-emitting device. In the case of using the reflective films 2 as lower electrodes, a layer for increasing the efficiency of injection of carriers into the organic layer may also be provided on the reflective films 2. For example, in the case of using the reflective films 2 as anodes, the efficiency of injection of holes can be improved by providing a layer of a material having a high work function. An electrically conductive metal oxide such as ITO or IZO can be used as the material having a high work function. On the other hand, in the case of using the reflective films 2 as cathodes, the efficiency of injection of electrons can be improved by providing a layer of a material having a low work function. An electron-injecting metal selected from alkali metals such as lithium, sodium and potassium, alkaline earth metals such as calcium, magnesium and strontium, and fluorides and so on thereof, or an alloy thereof with other metals or a compound thereof can be used as the material having a low work function. It is sufficient for the thickness of such a layer for increasing the efficiency of injection of carriers to be 10 nm or less.

The organic EL light-emitting layer 3 is formed on the reflective films 2 formed as described above. In the organic EL light-emitting device of the present invention, the organic EL light-emitting layer 3 has a structure comprising at least an organic light-emitting layer, and if necessary a hole injection layer, a hole transport layer, and/or an electron injection layer are interposed. Specifically, an organic EL light-emitting layer 3 having a layer structure such as the following is adopted.
(1) Organic light-emitting layer
(2) Hole injection layer/organic light-emitting layer
(3) Organic light-emitting layer/electron injection layer
(4) Hole injection layer/organic light-emitting layer/electron injection layer
(5) Hole injection layer/hole transport layer/organic light-emitting layer/electron injection layer Publicly known materials are used as the materials of the above-mentioned layers. To obtain luminescence from blue to blue/green in color, for example a fluorescent whitening agent of benzothiazole type, benzimidazole type, benzoxazole type or the like, a metal chelated oxonium compound, a styrylbenzene type compound, an aromatic dimethylidene type compound, or the like is preferably used in the organic light-emitting layer. Moreover, a quinoline derivative (e.g. an organometallic complex having 8-quinolinol as a ligand), an oxadiazole derivative, a perylene derivative, a pyridine derivative, a pyrimidine derivative, a quinoxaline derivative, a diphenylquinone derivative, a nitro-substituted fluorene derivative or the like can be used for an electron injection layer.

Next, the upper electrodes 4 are formed on the organic EL light-emitting layer 3. In the case of using the reflective films 2 as anodes, the upper electrodes 4 will be cathodes, whereas in the case of using the reflective films 2 as cathodes, the upper electrodes 4 will be anodes. In the device of the present invention, light is extracted via the upper electrodes 4, and hence the upper electrodes 4 must be transparent. A transparent electrically conductive oxide such as ITO or IZO is thus preferable as the upper electrodes 4 in the present invention. Furthermore, in the case of using the upper electrodes 4 as cathodes, a layer of a material having a low work function may be provided between the transparent electrically conductive oxide and the organic EL light-emitting layer 3, thus improving the efficiency of injection of electrons. As the material having a low work function in this case, an electron-injecting metal selected from alkali metals such as lithium, sodium and potassium, alkaline earth metals such as, calcium, magnesium and strontium, and fluorides and so on thereof, or an alloy thereof with other metals or a compound thereof can be used. To improve the efficiency of injection of electrons, it is sufficient for there to be a layer of the material having a low work function of thickness 10 nm or less, and moreover such a thickness is also preferable from the viewpoint of maintaining the required transparency.

The organic EL device of the present invention is preferably sealed to isolate the various constituent elements described above from the surrounding environment. The sealing material is required to have low permeability to oxygen and moisture, high durability, and high heat transfer ability. Furthermore, in the case that the light from the organic EL device is extracted via the sealing material, the sealing material is required to be transparent to the light emitted by the organic EL device. A commonly used material such as an acrylic resin can be used as the sealing material.

With the organic EL device of the present invention, the light from the organic EL light-emitting layer 3 may be used as is, or fluorescent color-converting material layers may be provided so that the light from the organic EL light-emitting layer 3 is subjected to wavelength conversion. The fluorescent color-converting material layers may be formed on the upper electrodes 4, or may be formed on a separate transparent substrate to form a color-converting filter, the color-converting filter then being bonded onto the EL device. The formation of these layers and the bonding (including the formation of layers required for the bonding) may be carried out using commonly used means.

Moreover, the organic EL device of the present invention may emit one type of light, or may emit a plurality of types of light of different colors. Preferably, the organic EL device is used as a display combined with a color-converting filter having red, green and blue light-emitting parts arranged in a matrix. In the case of using the organic EL device as a display, active matrix driving may be carried out using controlling elements such as TFTs, or passive matrix driving may be carried out using upper and lower electrodes having line patterns that extend in two orthogonal directions.

EXAMPLES 1 TO 3

An $Ni_3P$ film of thickness 100 nm was formed as a reflective film on a glass substrate by sputtering using a target having a composition of $Ni_3P$ (Example 1). Moreover, for comparison, a sample in which, instead of the $Ni_3P$, 100 nm of Al was formed by vapor deposition (Example 3), and a sample in which a metal electrode having a reflecting function was not formed, but rather 100 nm of amorphous $In_2O_3$:ZnO (ZnO molar ratio 5%, hereinafter abbreviated to 'IZO') was formed (Example 2) were manufactured.

Next, 10 nm of IZO was formed thereon by sputtering to match the work function to the injection level of the organic EL light-emitting layer. The electrode film was patterned using an ordinary photolithography process using a mask giving a pattern of stripes with a width of 2 mm and a pitch of 0.5 mm, thus obtaining reflective films. These reflective films were used as anodes. After that, the surface was subjected to cleaning using an oxygen plasma at room temperature.

The results of measuring the unevenness of the surface for the above three types of electrodes using an AFM are shown in Table 2. It can be seen that the surface roughness for the IZO/NiP/glass and the IZO/glass was the same as that of glass within the scope of experimental error, but the unevenness for the IZO/Al/glass was more than 10 times greater.

TABLE 2

Surface roughness of glass substrate and various types of lower electrodes

| Example | | Average surface roughness (nm) | Peak to valley (nm) |
| --- | --- | --- | --- |
| 1 | IZO (10 nm)/NiP (100 nm)/glass | 0.23 | 3.12 |
| 2 | IZO (110 nm)/glass | 0.23 | 3.15 |
| 3 | IZO (10 nm)/Al (100 nm)/ glass | 2.85 | 40.1 |
| | Glass | 0.21 | 3.06 |

An organic EL light-emitting layer was formed on the anodes. The structure of the organic EL light-emitting layer was made to be a 4-layer structure of hole injection layer/hole transport layer/light-emitting layer/electron injection layer as an organic film; 100 nm of copper phthalocyanine (CuPc) was formed as the hole injection layer, and 20 nm of 4,4'-bis[N-(1-naphthyl)-N-phenylamino]biphenyl($\alpha$-NPD) was formed as the hole transport layer. Furthermore, 30 nm of 4,4'-bis(2,2-diphenylvinyl)biphenyl(DPVBi) was formed as the light-emitting layer, and 20 nm of aluminum tris(8-quinolinolate) (Alq) was formed as the electron injection layer. 20 nm of copper phthalocyanine (CuPc) was further formed to alleviate damage upon forming the upper transparent electrodes.

After the formation of the above films had been completed, 200 nm of amorphous $In_2O_3$:ZnO (ZnO molar ratio 5%) was formed by sputtering using a mask giving a pattern of stripes with a width of 2 mm and a pitch of 0.5 mm extending in a direction orthogonal to the anode lines, thus forming cathodes. As a result, an organic EL light-emitting device having a plurality of pixels of dimensions 2 mm×2 mm was obtained.

Figure 2:
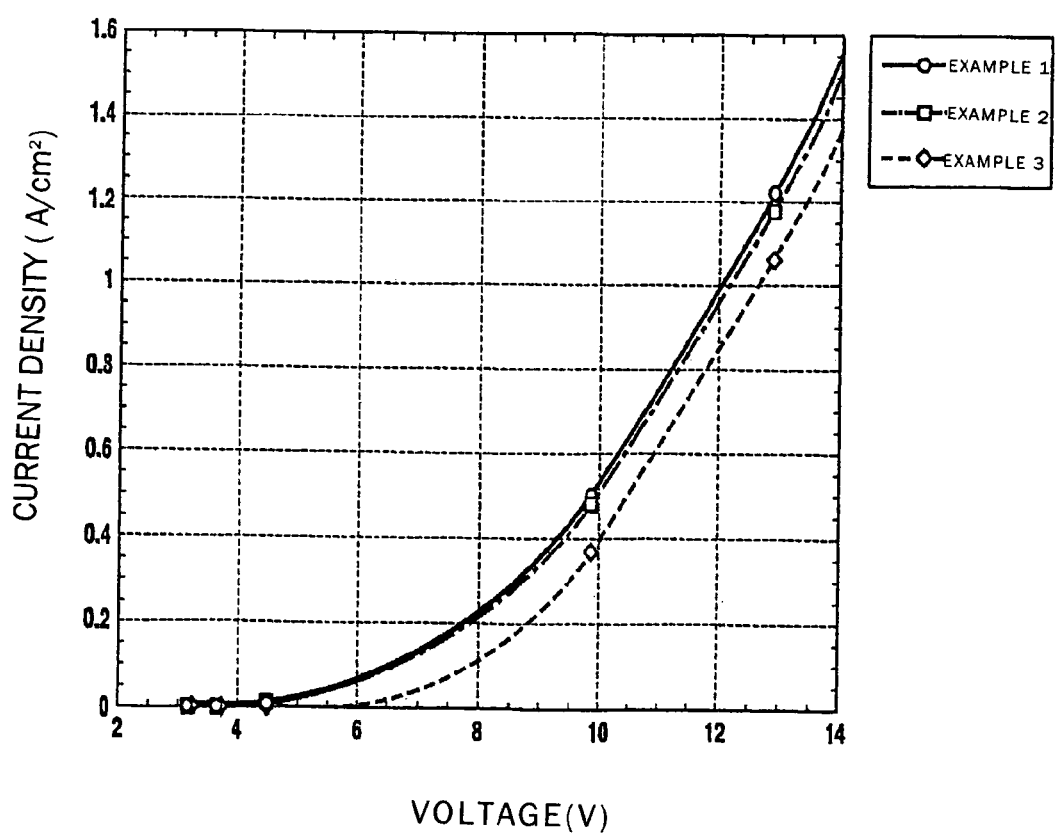
FIG. 2 is a graph comparing the current-voltage characteristic for organic EL light-emitting devices of Examples 1 to 3.

FIG. 2 shows the typical current-voltage characteristic for the three types of sample manufactured. The three types of sample show approximately the same characteristic, this being because the layer structure of the organic EL light-emitting layer, which determines the current-voltage characteristic, is the same for each. Note, however, that for Example 3, there were parts (pixels) where an abnormal current flowed due to short-circuiting occurring from the outset.

The light emission efficiency at a current density of 0.01 $A/cm^3$ was 10 cd/A for Example 1, 11 cd/A for Example 3, and 5 cd/A for Example 2. The efficiency was low for Example 2 because there are no reflective films and hence light escapes from the rear surface, but taking this into consideration, it is thought that light-emitting devices of approximately the same characteristics were obtained for the three types.

The insulation breakdown voltage was measured as a quantitative indicator of short-circuiting of pixels. In the case of TFT driving, a voltage is only applied in the forward direction, and hence essentially one should look at insulation breakdown by measuring a current that flows excessively during forward bias, but there is a problem of the S/N ratio, and hence the excessive current cannot be detected. Here, evaluation was thus carried out by sweeping the voltage at 1 V/sec in the reverse bias direction, and defining the voltage at which a current of 1 $\mu$A was detected as the reverse bias breakdown strength.

Figure 3:
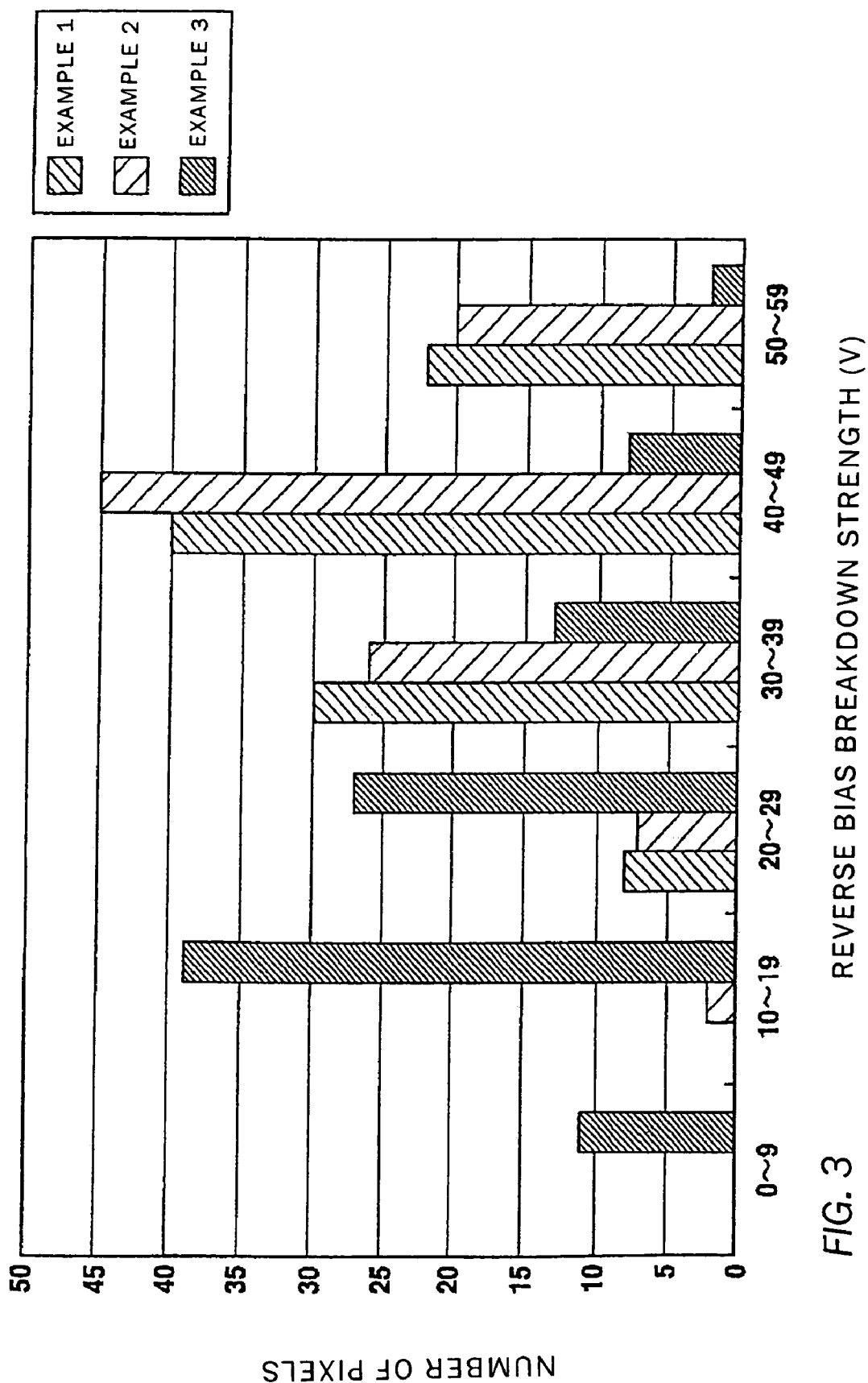
FIG. 3 is a histogram of the reverse bias breakdown strength for the organic EL light-emitting devices of Examples 1 to 3.

FIG. 3 shows the frequency distribution of the reverse bias breakdown strength obtained by carrying out measurements on 100 pixels for each of the organic EL light-emitting devices of Examples 1 to 3. It can clearly be seen from FIG. 3 that the reverse bias breakdown strength is lower for the device of Example 3 (IZO/Al/glass) having severe surface unevenness. It is thought that this is because, due to the surface unevenness, there are parts where the thickness of the organic light-emitting layer is low and hence the anode and cathode are close to one another. Note that out of the 11 pixels for which the reverse bias breakdown strength was 0 to 9 V for Example 3, there was complete leakage for 5 of these pixels, with emission of light not being observed at all even upon applying a voltage in the forward direction.

Next, an investigation into minute defects in the pixels was carried out. A current was passed in the forward direction, and the pixels were observed using a microscope so as to look for non-light-emitting points of size several $\mu$m to several tens of $\mu$m (dark spots). With the device of Example 3, approximately 20 dark spots were observed on average in a 2 mm-square pixel, but with Examples 1 and 2, good devices were obtained, with approximately 2 to 3 dark spots being observed at most in a pixel, and most of the pixels not having dark spots.

EXAMPLES 4 TO 8

Various reflective films were formed on glass substrates, varying the target, the film formation power, and the film formation time. The thickness, reflectivity and surface unevenness for the reflective films obtained are shown in Table 3.

TABLE 3

Film formation conditions and reflective film properties

| Example | Target composition | Film formation power (W) | Film formation time (s) | Film thickness (nm) | Reflectivity (%) | Surface unevenness Average roughness (nm) | Surface unevenness Peak to valley (nm) |
|---|---|---|---|---|---|---|---|
| 4 | Ni₃P | 25 | 600 | 124 | 44.1 | 0.22 | 3.1 |
| 5 | Ni₃B | 111 | 212 | 139 | 39.4 | 0.21 | 3.13 |
| 6 | Cr₃P | 95 | 201 | 124 | 56.6 | 0.23 | 3.15 |
| 7 | Cr₃B | 58 | 390 | 126 | 61.7 | 0.22 | 3.12 |
| 8 | Cr₃B | 25 | 393 | 51.4 | 62.3 | 0.2 | 3 |
|  |  |  |  |  | Glass | 0.21 | 3.06 |

From Table 3, it can be seen that the reflective films formed from amorphous alloys have approximately the same flatness as the substrate surface.

The present invention can be used for an organic EL light-emitting device and a method of manufacturing the same. According to the present invention, as described above, the reflective films are formed using an amorphous alloy, whereby a good flat surface with reduced unevenness is obtained. With an organic EL light-emitting device in which an organic EL light-emitting layer and upper electrodes are formed on the reflective films, there is little occurrence of short-circuiting or dark spots, and hence an excellent device having good light emission efficiency, high reliability, and improved image quality can be obtained.

What is claimed is:

1. An organic EL light-emitting device comprising:
a substrate;
thin films having a reflecting function formed on the substrate;
an organic EL light-emitting layer; and
upper electrodes;
wherein the thin films having a reflecting function are formed from an amorphous alloy, characterized in that the amorphous alloy is a metal-boron alloy, the metal is one or a plurality selected from transition metals, and the metal-boron alloy contains 10 to 50 atomic percent of boron.

2. The organic EL light-emitting device according to claim 1, characterized in that an atomic radius ratio r/R (R>r) of elements constituting the amorphous alloy is not more than 0.9.

3. The organic EL light-emitting device according to claim 1, characterized in that the thin films having a reflecting function are sputtered or vapor deposited thin films.

4. The organic EL light-emitting device according to claim 1, wherein the thin films having a reflecting function is the lower electrode in the device.

5. An organic EL light-emitting device comprising:
a substrate;
thin films having a reflecting function formed on the substrate;
an organic EL light-emitting layer; and
upper electrodes;
wherein the thin films having a reflecting function are formed from an amorphous alloy, characterized in that the amorphous alloy is a metal-lanthanide alloy, the metal is one or a plurality selected from transition metals, and the metal-lanthanide alloy contains 10 to 50 atomic percent of a lanthanide.

6. The organic EL light-emitting device according to claim 5, characterized in that the thin films having a reflecting function are sputtered or vapor deposited thin films.

7. The organic EL light-emitting device according to claim 5, wherein the thin films having a reflecting function is the lower electrode in the device.

8. An organic EL light-emitting device comprising a substrate, thin films having a reflecting function formed on the substrate, an organic EL light-emitting layer, and upper electrodes, the organic EL light-emitting device characterized in that the thin films having a reflecting function are formed from an amorphous alloy wherein either
(i) the amorphous alloy is a metal-boron alloy, the metal is one or a plurality selected from transition metals, and the metal-boron alloy contains 10 to 50 atomic percent of boron, or
(ii) wherein the amorphous alloy is a metal-lanthanide alloy, the metal is one or a plurality selected from transition metals, and the metal-lanthanide alloy contains 10 to 50 atomic percent of a lanthanide.

9. The organic EL light-emitting device according to claim 8, characterized in that the thin films having a reflecting function are sputtered or vapor deposited thin films.

10. The organic EL light-emitting device according to claim 8, wherein the thin films having a reflecting function is the lower electrode in the device.

* * * * *